United States Patent [19]
Sasaki

[11] Patent Number: 5,876,221
[45] Date of Patent: Mar. 2, 1999

[54] SURFACE MOUNT CONTACT ASSEMBLY FOR PRINTED CIRCUIT BOARD

[75] Inventor: Takinori Sasaki, Hadano, Japan

[73] Assignee: The Whitaker Corporation, Wilmington, Del.

[21] Appl. No.: 907,203

[22] Filed: Aug. 6, 1997

[30] Foreign Application Priority Data

Aug. 9, 1996 [JP] Japan ..................................... 8-227632

[51] Int. Cl.⁶ .................................................. H01R 9/09
[52] U.S. Cl. ............................................. 439/79; 439/876
[58] Field of Search .................. 439/79, 80, 70, 439/892, 876

[56] References Cited

U.S. PATENT DOCUMENTS

| Re. 33,268 | 7/1990 | Grabbe | 439/70 |
| 4,979,903 | 12/1990 | Gosselin | 439/876 |
| 5,104,341 | 4/1992 | Gilissen et al. | 439/608 |
| 5,201,664 | 4/1993 | Korsunsky | 439/892 |
| 5,277,596 | 1/1994 | Dixon | 439/79 |
| 5,348,482 | 9/1994 | Rudy, Jr. et al. | 439/61 |
| 5,472,349 | 12/1995 | Dixon et al. | 439/79 |
| 5,727,957 | 3/1998 | Hashimoto et al. | 439/79 |

FOREIGN PATENT DOCUMENTS

| A-3-257776 | 3/1990 | Japan . |
| A-5-174910 | 12/1991 | Japan . |
| A-7-226573 | 2/1994 | Japan . |

*Primary Examiner*—Neil Abrams
*Assistant Examiner*—Antoine Ngandjui
*Attorney, Agent, or Firm*—Katherine A. Nelson

[57] ABSTRACT

The assembly of contacts for printed circuit boards 1, 1a consists of contacts 2, 2' and a housing 4, 4' fabricated by insert molding method. The mounting sections 8, 8' have lugs which fit into openings made in pads of the printed circuit board 50 in a staggered pattern. The printed circuit board assembly 70 consists of the printed circuit board 50 with contact assemblies 1, 1a attached to the bottom edge 56 and front edge 62 by surface mounting technique.

12 Claims, 4 Drawing Sheets

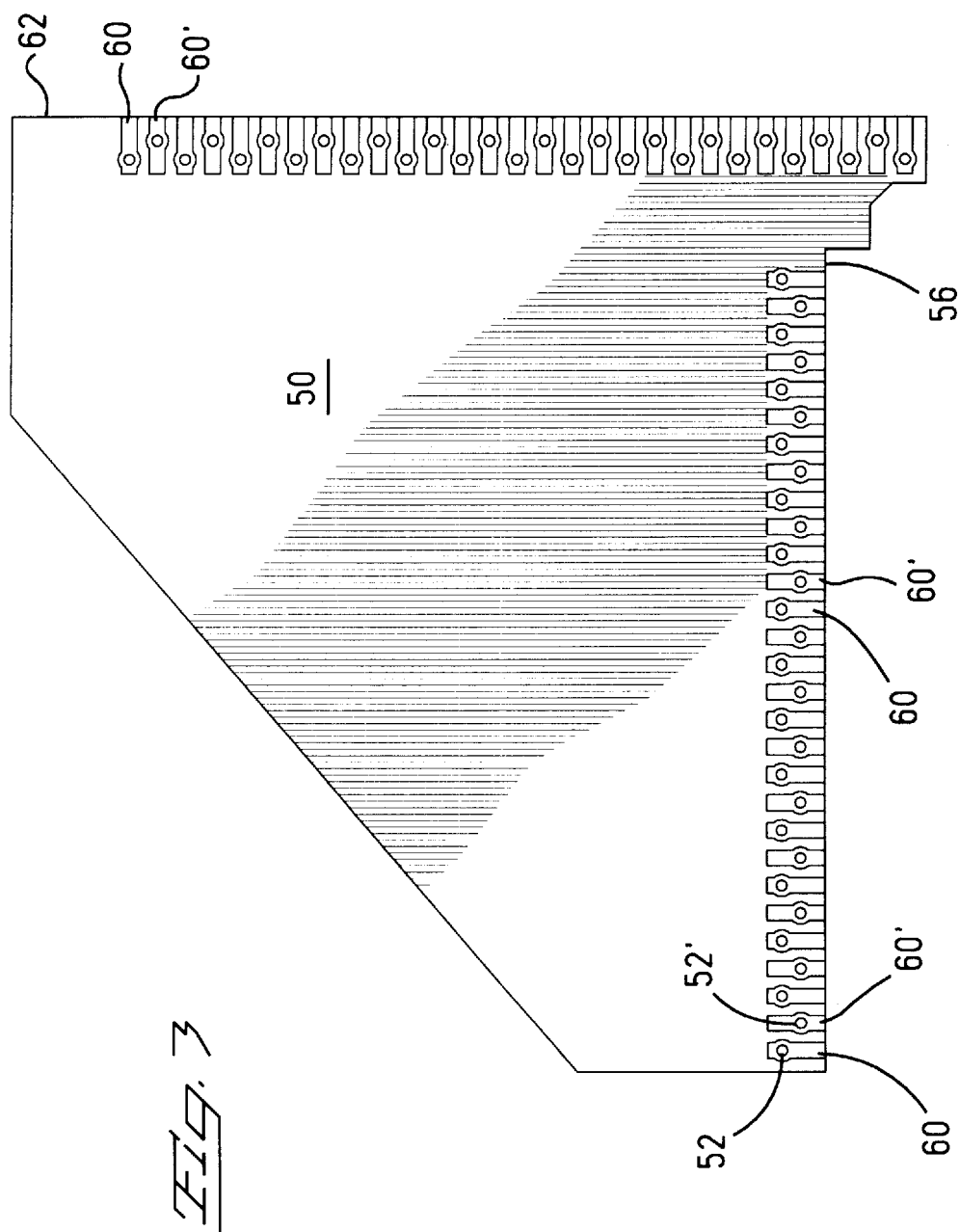

SURFACE MOUNT CONTACT ASSEMBLY FOR PRINTED CIRCUIT BOARD

FIELD OF THE INVENTION

This invention relates to assemblies of contacts for printed circuit boards that are retained in a housing fabricated by the insert molding method and to assemblies of printed circuit boards in which such contact assemblies are used.

BACKGROUND OF THE INVENTION

Devices used for the connection of printed circuit boards to other devices are known in the art, such as, for example, connecting device described in published Patent Application No. JP-A-7-226573. As it can be seen from FIG. 5, the connecting device of the '226573 application has a housing 120 that receives a printed circuit board 100. Contacts 122 are arranged in the housing 120 and engage conductive pads 102 made along the edge of the printed circuit board 100 when the card is inserted into the housing. The housing 120 is electrically connected to another printed circuit board or other device.

However, in this method, the contacts have a complicated configuration to impart elasticity and resilience necessary to maintain reliable connection with the pads. In addition, grooves 124, 126 must be made in the housing in order to accommodate the printed circuit board, which results in a higher cost of production.

Therefore, considerations were given to various methods of connecting contacts to a printed circuit board 100, including surface mounting technique, insertion of contacts in openings provided in other printed circuit boards, soldering, etc. However, insertion of the front ends of contacting sections in openings made in other printed circuit boards is difficult owing to irregularities in their positions.

SUMMARY OF THE INVENTION

Taking into consideration the above mentioned shortcomings, the purpose of this invention is to offer an assembly of contacts for printed circuit boards distinguished by a simple design and cost effective manufacturing that makes it possible to implement precise and easy connection of printed circuit boards with other devices.

Another purpose of this invention is to offer a cost effective printed circuit board assembly that can be used as an intermediate device facilitating multiple contact connections with printed circuit boards, connectors and other apparatus, the assembly being distinguished by a simple design.

In order to achieve the above purposes, the assembly of contacts for printed circuit board according to this invention is characterized by the fact that a plurality of contacts having a mounting section at one end for surface mounting to a printed circuit board, a contacting section for the connection to other devices at the other end and lugs to maintain required positioning of the mounting sections are retained in a plastic housing fabricated by the insert molding method so that said mounting sections are arrayed in a row and both mounting sections and contacting sections are exposed from the housing.

The assembly of printed circuit board according to this invention is characterized in that a plurality of contacts having a mounting section at one end, a contacting section for the connection to other devices at the other end and lugs to maintain required positioning of said mounting sections and retained in a plastic housing so that said mounting sections and contacting sections are exposed from the housing, the housing having an edge surface perpendicular to the mounting sections; a printed circuit board having conductive pads along at least two different edges thereof corresponding to the mounting sections of the contacts and openings corresponding to the lugs. The assembly of contacts for a printed circuit board is located in such a way that the edge thereof extends on both sides of the printed circuit board edge, the lugs fit into the openings and the mounting sections are connected to the pads by surface mounting technique. In the embodiment shown, the housing is fabricated by the insert molding method. It is to be understood that the invention is not limited to this method of forming the housing.

An embodiment of the invention will now be described by way of example with reference to attached drawings.

BRIEF DESCRIPTION OF THE DRAWINGS

FIGS. 3 and 4 are plan views of the printed circuit board assembly including a printed circuit board and a contact assembly.

DETAILED DESCRIPTION OF AN EMBODIMENT OF THE INVENTION

Figure 1:
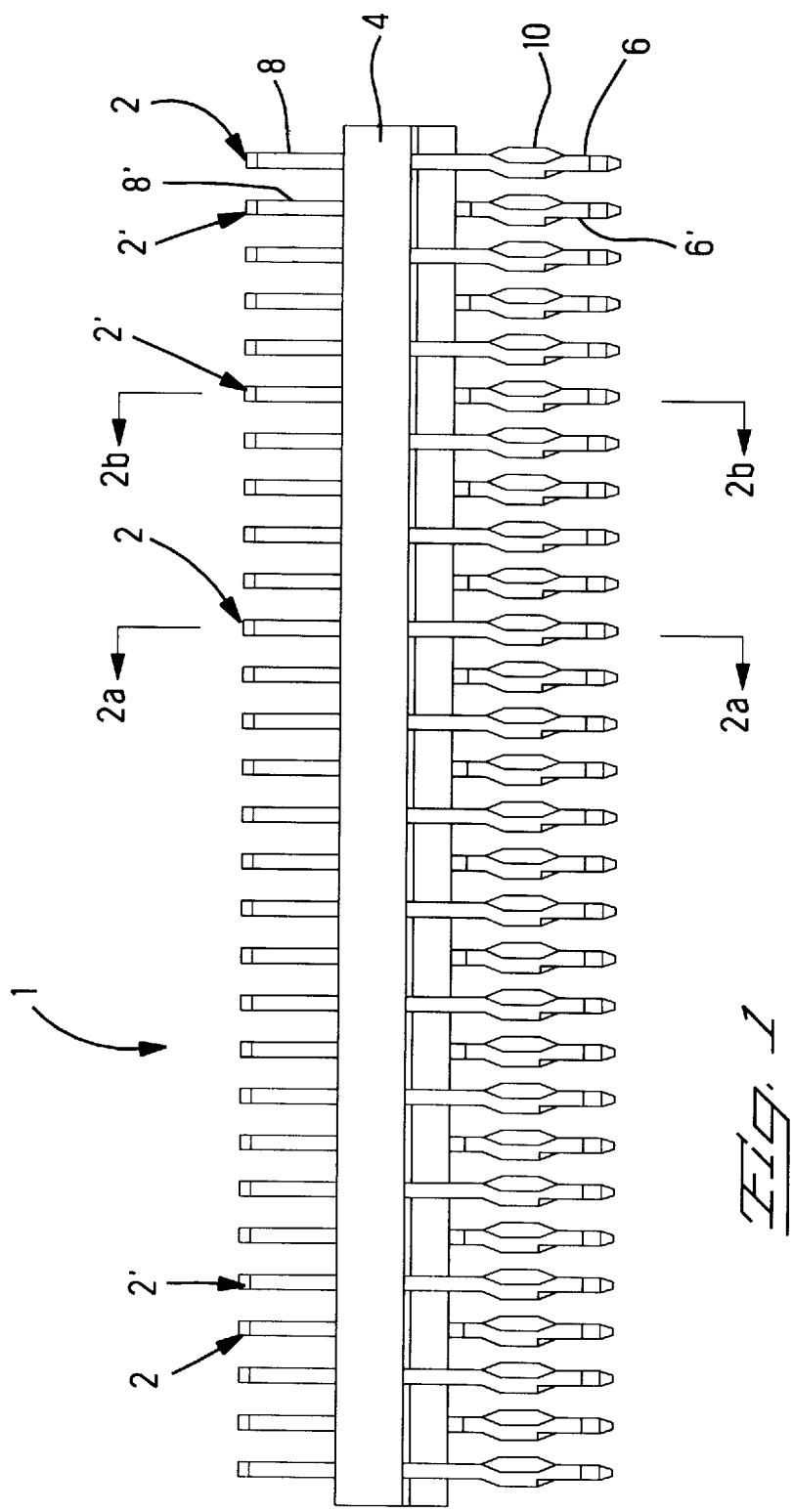
FIG. 1 is a plan view of the contact assembly for a printed circuit board.

As is shown in FIGS. 1 and 2, the assembly of contacts 1 comprises a plurality of contacts 2, 2' and an insulating housing 4 in which the contacts 2, 2' are retained. The housing 4 is fabricated by insert molding so that it covers middle sections of contacts 2, 2'. The contacts 2, 2' have thin long mounting terminating sections 8, 8' at one end intended for the soldering to printed circuit board 50 (see FIG. 2), and connecting sections 6, 6' at the other end intended for the insertion in the openings (not shown) of, for example, a mother board (not shown). Connecting sections 6, 6' can be bent in opposite directions so that they can go on opposite sides of the printed circuit board and have compliant sections 10' which provide elasticity and resiliency in the direction perpendicular to the axis of the contacts 2, 2'. The use of compliant sections 10 allowing for elastic matching with openings of mother board is known in the art. The mounting sections 8, 8' are located in the same plane, while connecting sections 6, 6', are located in two different planes shifted from the generating plane of mounting sections 8. Adjacent connecting sections 6 and 6' are arrayed in a staggered pattern. For detailed explanations of the design of the contact assembly 1, see FIG. 2.

Figure 2A:
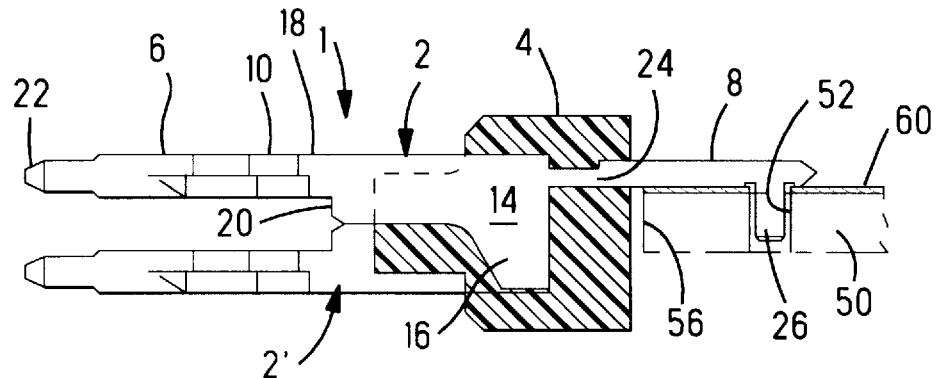
FIGS. 2a and 2b are cross-sectional views through lines 2a—2a and 2b—2b of FIG. 1.
Figure 2B:
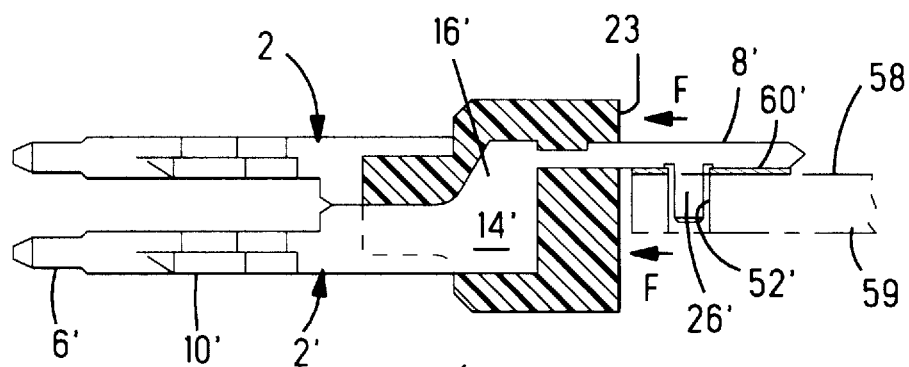
Figure 5:
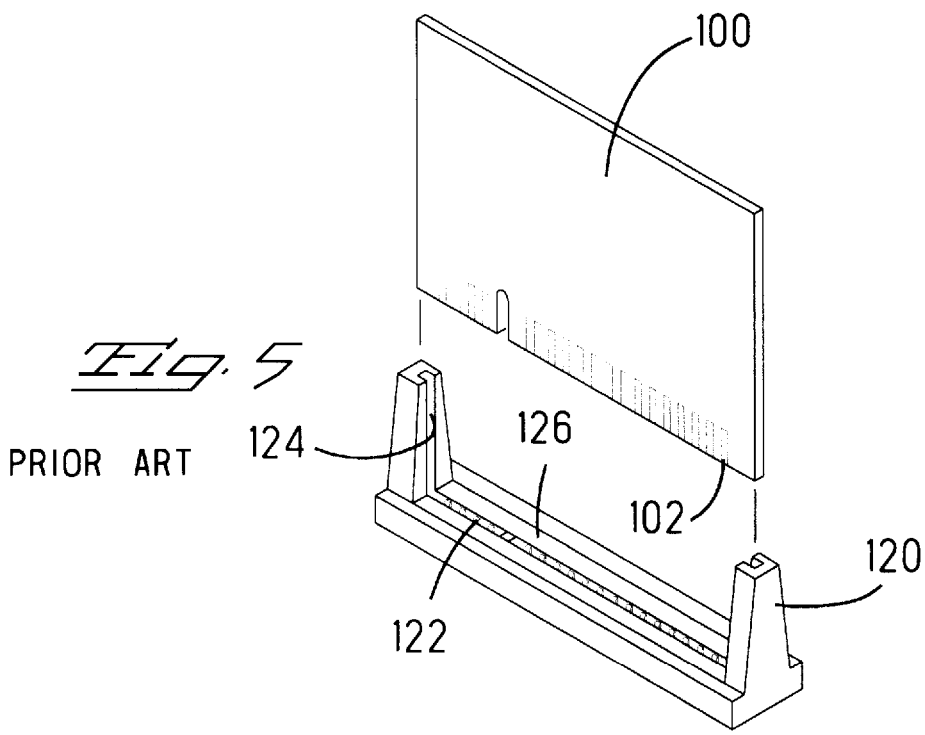
FIG. 5 is an isometric view of a conventional connector of the prior art mounted on a printed circuit board.

FIG. 2a illustrates contact 2 and FIG. 2b depicts contact 2'. The main body 14 of the contact 2 has a wide blade 16 in its back section whose purpose is to provide positive retention in the housing 4 fabricated by insert molding. The main body 14 is joined to the rest of the connecting section 6 through a shoulder 20 limited on the top by the edge 18. The front tip 22 of the connecting section 6 is beveled to facilitate the insertion in openings of the mother board. At the back end, the main body 14 is connected to the mounting section 8 via a constriction section 24. At the front end of the mounting section 8, a lug 26 is formed as an integral part of the contact. The lug 26 is inserted in the opening 52 of the printed circuit board 50 shown by dotted lines, thus determining precise position of the contact assembly 1. The mounting section 8 is soldered to pad 60.

Figure 4:
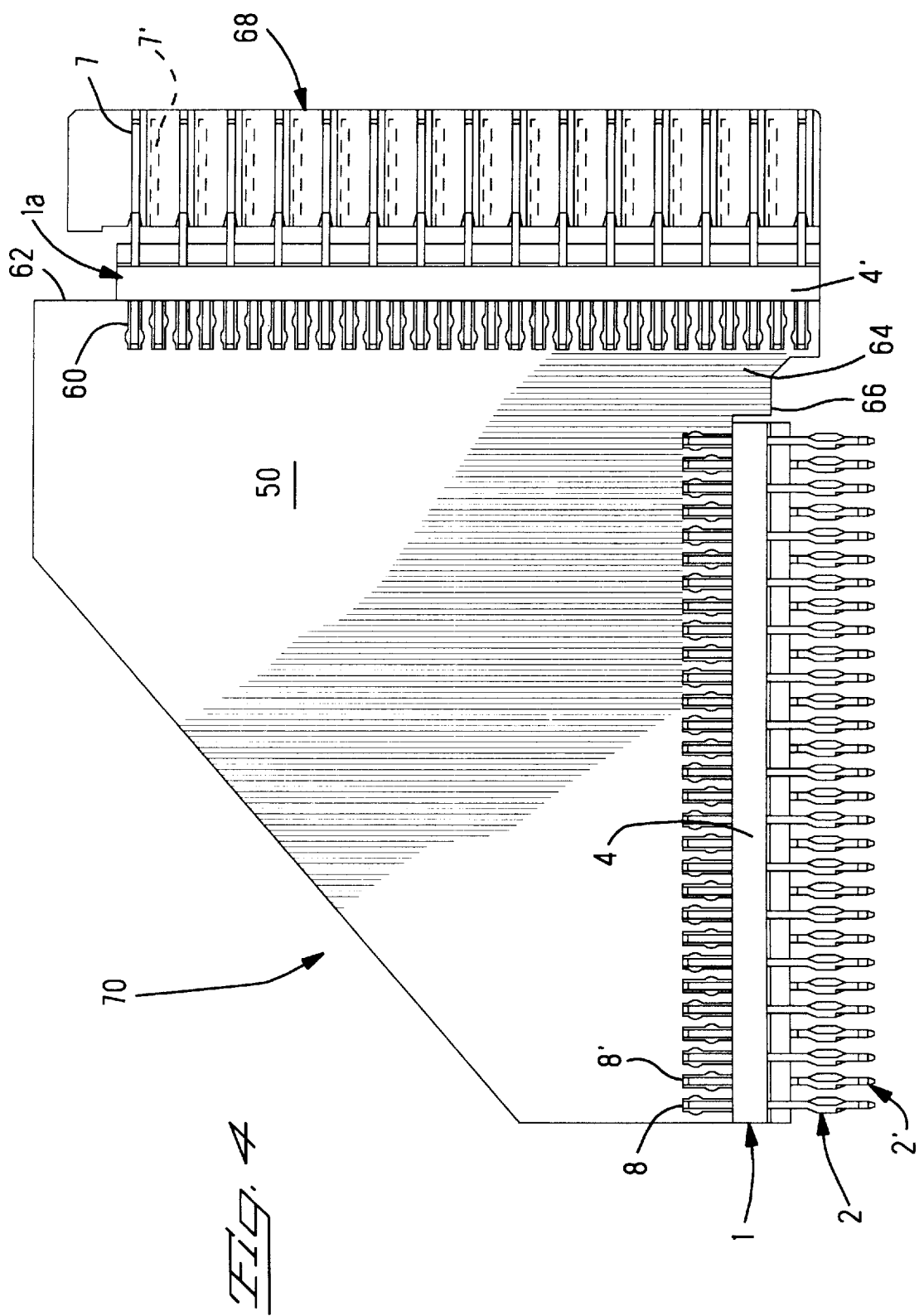

FIG. 2b depicts the contact 2'. The difference between the contact 2' and the contact 2 is in the mounting section 8'. The part to the front of the main body 14' is basically the same as the similar part of the contact 2, but the mounting section 8' is connected to the blade 16' and the lug 26' is made approximately in the middle of the mounting section 8'. The lug 26' is inserted in the opening 52' made in the mother board 50, thus also determining position of the assembly. Openings 52 and 52' are located at different distances from the edge 56 of the mother board 50 forming a staggered pattern along the edge 56, as can be seen in FIG. 3. Since the mounting sections 8, 8' are arrayed in the same plane, they can be mounted on the conductive pads 60, 60' formed on the surface 58 of the printed circuit board 50 to define circuit board assembly 70 (FIG. 4). The connecting sections 6' are arrayed in one row below the row of connecting sections 6.

Since the edge 56 of the printed circuit board 50 comes upon the edge 23 of the contact assembly 1 at approximately the middle thereof, the edge 23 extends outwardly of surfaces 58, 59 of the printed circuit board 50. When the printed circuit board assembly 70 is to be mounted to the mother board by inserting the connecting sections 6, 6' in the openings, the assembly can be pressed by means of a tool applied to the exposed parts of the edge 23 in the direction shown by arrows F. This makes it possible to easily mount such assemblies without soldering operations.

The configuration of printed circuit board 50 will now be described with reference to FIG. 3. In the embodiment shown, the board 50 is of nearly triangular configuration and it has pads 60, 60' made along the bottom 56 and front edge 62 of the board at a pitch corresponding to that of contacts 2, 2'. The positions of openings 52, 52' made in pads 60, 60' are different. That is, openings 52 are located in pads 60 at a certain distance from the bottom edge 56 or the front edge 62. Openings 52' are located in pads 60' at a shorter distance from the bottom edge 56 or the front edge 62. Since the openings 52, 52' are arrayed in a staggered pattern, the lands surrounding them do not interfere with each other. This makes it possible to arrange pads 60, 60' at a high density. Material for the printed circuit board can be any that allows for the formation of pads, such as glass fiber reinforced epoxy, etc. Pads 60, 60' of the bottom edge 56 and the front edge 62 are interconnected by conducting traces (not shown).

FIG. 4 depicts the printed circuit board 50 to which a contact assembly 1 and another embodiment of a contact assembly 1a are connected. The housing 4 of the contact assembly 1 covers approximately the entire length of the bottom edge 56 of the printed circuit board 50. The front edge 62 of the printed circuit board 50 has an extension 64 extending below the bottom edge 56. A cut-out 66 is provided in the extension 64 to accommodate the edge of the mother board.

A contact assembly 1a of a different embodiment is connected to the front edge 62 of the printed circuit board 50. The contact assembly 1a having the housing 4' is basically the same as the contact assembly 1. The difference consists in the fact that connecting sections 7, 7' do not have compliant sections 10 as the connecting sections 6, 6'. Another difference is that the connecting sections 7, 7' are provided with a cover 68 to protect them during transportation of the printed circuit board assembly 70. Using such printed circuit board assemblies, it is possible to attach a number of parallel or vertical boards. By removing the cover 68, it is possible to attach a bundle of connectors (not shown) to the printed circuit board 50, thus providing for multi-contact electrical connection.

The discussion above is directed to two embodiments of this invention, however, it must be understood that this invention also covers various modifications. For example, it is possible to mount a contact assembly at other edge of the printed circuit board as well. It is also possible to attach the front edge of the printed circuit board to another board rather than connectors.

The assembly of contacts for printed circuit boards according to this invention consists of contacts having alignment lugs on the mounting sections of the contacts and a housing fabricated by insert molding retaining the contacts and exposing their mounting sections and contacting sections. The structure provides the advantage of making it possible to simplify the design, thus reducing the cost, and at the same time providing for a precise arrangement of the mounting sections and connecting sections. The invention allows for an easy and accurate connection between printed circuit boards and other devices, thus improving reliability of electrical connections and simplifying the assembly processes.

The printed circuit board assembly according to this invention consists of the board having pads corresponding to the mounting sections of the contacts and openings corresponding to contact lugs arranged at least along one edge and assembly of contacts mounted to the board by surface mounting technique, thus producing the following advantage.

It provides for a simple design making it possible to easily and precisely implement multiple contact connections, therefore, providing for reliable electrical connections and simple assembly process.

I claim:

1. An electrical connector for electrical connection to conductive pads on a circuit board, comprising a dielectric housing having a front surface and a rear surface;

an upper row of electrical contacts and a lower row of electrical contacts having main bodies, secured in said dielectric housing, terminating sections extending outwardly from the main bodies and outwardly from the rear surface of the dielectric housing and connecting sections extending outwardly from the main bodies and outwardly from the front surface of the dielectric housing;

said terminating sections are disposed in a plane so that they can be terminated to respective conductive pads on the circuit board;

the connection sections of the upper row of electrical contacts and the connecting sections of the lower row of electrical contacts are disposed in parallel planes; and lugs on the terminating sections for insertion into holes in the circuit board so that the terminating sections are positioned along the respective conductive pads for electrical connection thereto.

2. An electrical connector as claimed in claim 1, wherein the terminating sections are disposed in the same plane as the connecting sections of the upper row of electrical contacts.

3. An electrical connector as claimed in claim 1, wherein the main bodies have wide blades within the dielectric housing.

4. An electrical connector as claimed in claim 3, wherein the wide blades of the upper row of electrical contacts are directed downwardly, and the terminating sections of the upper row of electrical contacts extend outwardly from the main bodies thereof.

5. An electrical connector as claimed in claim 3, wherein the wide blades of the lower row of electrical contacts are directed upwardly, and the terminating sections of the lower row of electrical contacts extend outwardly from the wide blades.

6. An electrical connector as claimed in claim 1, wherein the lugs on the terminating sections of the upper row of electrical contacts are staggered with respect to the lugs on the terminating sections of the lower row of electrical contacts.

7. A circuit board connector assembly, comprising
   a circuit board having conductive pads disposed along an edge thereof, said conductive pads having holes therein;
   a dielectric housing having an upper row of electrical contacts and a lower row of electrical contacts, main bodies of the electrical contacts secured in the dielectric housing terminating sections extending outwardly from the main bodies and outwardly from a rear surface of the dielectric housing in a plane in electrical engagement with respective conductive pads on the circuit board;
   lugs on the terminating sections disposed in the holes of the respective conductive pads; and
   connecting sections extending outwardly from the main bodies and from a front surface of the dielectric housing with the connecting sections of the upper row of electrical contacts and the connecting sections of the lower row of electrical contacts being disposed in parallel rows.

8. A circuit board connector assembly as claimed in claim 7, wherein the terminating sections are disposed in the same plane as the connecting sections of the upper row of electrical contacts.

9. A circuit board connector assembly as claimed in claim 7, wherein the main bodies have wide blades within the dielectric housing.

10. A circuit board connector assembly as claimed in claim 9, wherein the wide blades of the upper row of electrical are directed downwardly, and the terminating sections of the upper row of electrical contacts extend outwardly from the main bodies thereof.

11. A circuit board connector assembly as claimed in claim 9, wherein the wide blades of the lower row of electrical contacts are directed upwardly, and the terminating sections of the lower row of electrical contacts extend outwardly from the wide blades.

12. A circuit board connector assembly as claimed in claim 7, wherein the lugs on the terminating sections of the upper row of electrical contacts are staggered with respect to the lugs on the terminating sections of the lower row of electrical contacts.

* * * * *